(12) United States Patent
Brandl et al.

(10) Patent No.: US 11,031,531 B2
(45) Date of Patent: Jun. 8, 2021

(54) OPTOELECTRONIC COMPONENT AND METHOD OF PRODUCING AN OPTOELECTRONIC COMPONENT

(71) Applicant: OSRAM Opto Semiconductors GmbH, Regensburg (DE)

(72) Inventors: Martin Brandl, Kelheim (DE); Markus Pindl, Tegernheim (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/478,996

(22) PCT Filed: Jan. 24, 2018

(86) PCT No.: PCT/EP2018/051654
§ 371 (c)(1),
(2) Date: Jul. 18, 2019

(87) PCT Pub. No.: WO2018/138114
PCT Pub. Date: Aug. 2, 2018

(65) Prior Publication Data
US 2019/0355882 A1 Nov. 21, 2019

(30) Foreign Application Priority Data
Jan. 24, 2017 (DE) .......................... 102017101267.2

(51) Int. Cl.
*H01L 33/54* (2010.01)
*H01L 33/20* (2010.01)
*H01L 33/48* (2010.01)
*H01L 33/40* (2010.01)

(52) U.S. Cl.
CPC .............. *H01L 33/54* (2013.01); *H01L 33/20* (2013.01); *H01L 33/486* (2013.01); *H01L 33/40* (2013.01)

(58) Field of Classification Search
CPC ....... H01L 33/54; H01L 33/20; H01L 33/486; H01L 33/40
USPC .......................................................... 257/99
See application file for complete search history.

(56) References Cited

U.S. PATENT DOCUMENTS

| 2007/0106172 A1* | 5/2007 | Abreu .................. A61B 5/0002 600/549 |
| 2010/0165600 A1* | 7/2010 | Ku .......................... F21V 7/30 362/84 |
| 2010/0237370 A1* | 9/2010 | Kim ...................... H01L 33/504 257/98 |

(Continued)

FOREIGN PATENT DOCUMENTS

WO 2013/137593 A1 9/2013

*Primary Examiner* — Dzung Tran
(74) *Attorney, Agent, or Firm* — DLA Piper LLP (US)

(57) ABSTRACT

An optoelectronic component includes a housing including a first cavity bounded by a first wall, wherein a circumferentially extending first step is formed at an inner side of the first wall, the first step circumferentially extends around the first cavity obliquely with respect to a bottom of the first cavity, a first optoelectronic semiconductor chip is arranged at the bottom of the first cavity, the first optoelectronic semiconductor chip is embedded into a first potting material arranged in the first cavity and extending from the bottom of the first cavity as far as the first step, and a first potting surface of the first potting material is formed at the first step.

10 Claims, 4 Drawing Sheets

(56) References Cited

U.S. PATENT DOCUMENTS

| | | | |
|---|---|---|---|
| 2011/0069496 A1* | 3/2011 | Ing | F21V 5/007 362/311.02 |
| 2011/0101385 A1* | 5/2011 | Medendorp, Jr. | B29C 43/18 257/88 |
| 2011/0222280 A1 | 9/2011 | Kim | |
| 2011/0241028 A1 | 10/2011 | Park et al. | |
| 2014/0367633 A1* | 12/2014 | Bibl | H01L 25/0753 257/13 |
| 2015/0060905 A1* | 3/2015 | Nam | H01L 33/60 257/89 |

* cited by examiner

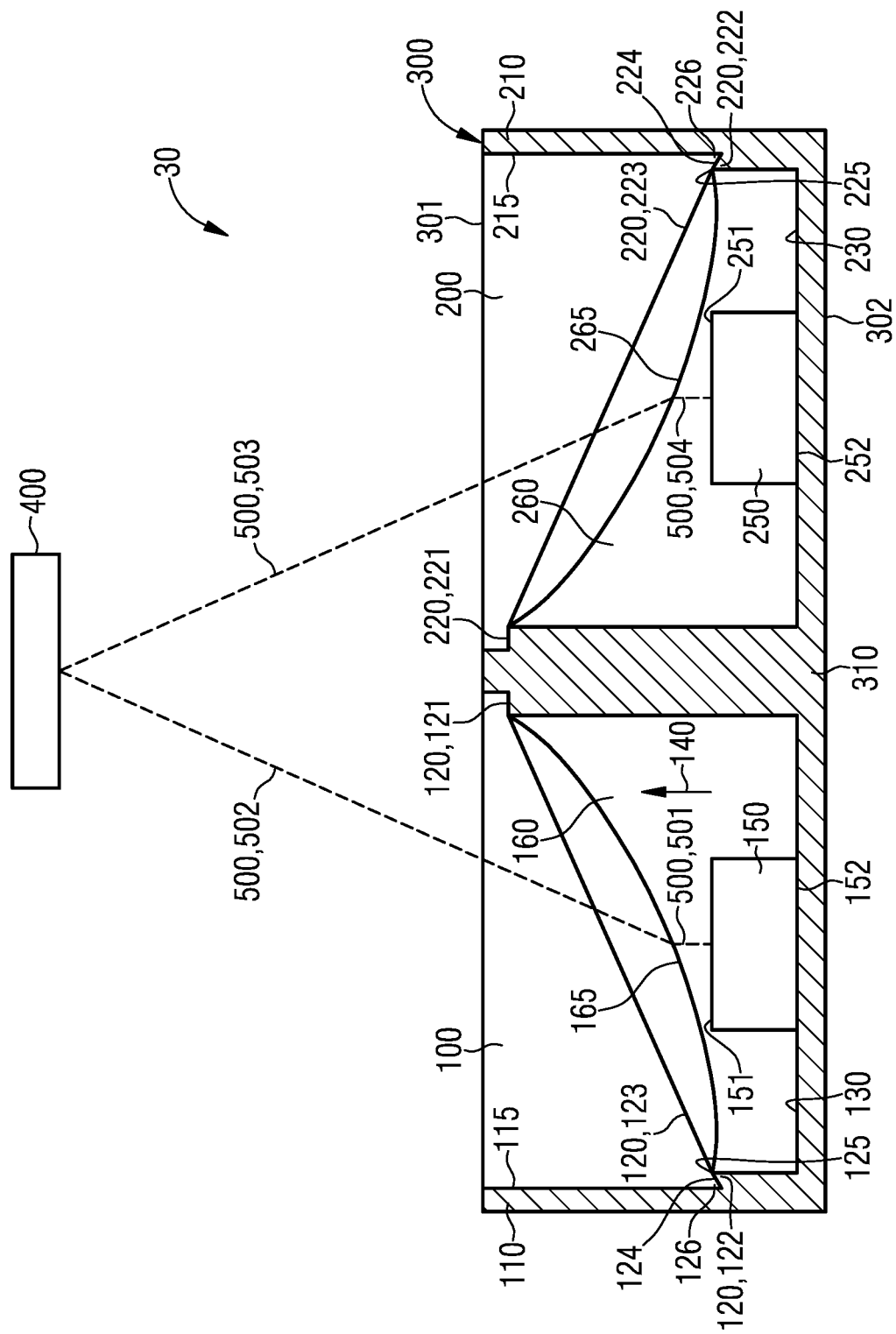

OPTOELECTRONIC COMPONENT AND METHOD OF PRODUCING AN OPTOELECTRONIC COMPONENT

TECHNICAL FIELD

This disclosure relates to an optoelectronic component and a method of producing an optoelectronic component.

BACKGROUND

It is known to form optoelectronic components comprising housings comprising a cavity that receives an optoelectronic semiconductor chip. A potting material embedding the optoelectronic semiconductor chip may be arranged in the cavity.

It is further known to equip optoelectronic components with optical elements that deflect or shape emitted electromagnetic radiation.

SUMMARY

We provide an optoelectronic component including a housing including a first cavity bounded by a first wall, wherein a circumferentially extending first step is formed at an inner side of the first wall, the first step circumferentially extends around the first cavity obliquely with respect to a bottom of the first cavity, a first optoelectronic semiconductor chip is arranged at the bottom of the first cavity, the first optoelectronic semiconductor chip is embedded into a first potting material arranged in the first cavity and extending from the bottom of the first cavity as far as the first step, and a first potting surface of the first potting material is formed at the first step.

We also provide a method of producing an optoelectronic component, including providing a housing including a first cavity, a first wall bounding the first cavity, wherein a first step circumferentially extending obliquely with respect to a bottom of the first cavity is formed at the inner side of the first wall; arranging a first optoelectronic semiconductor chip on the bottom of the first cavity; and arranging a first potting material in the first cavity, wherein the first potting material extends from the bottom of the first cavity as far as the first step, and a first potting surface of the first potting is formed at the first step.

BRIEF DESCRIPTION OF THE DRAWINGS

FIG. 4 schematically shows a sectional illustration of a third example of the optoelectronic component comprising concave potting surface.

LIST OF REFERENCE SIGNS

Figure 1:
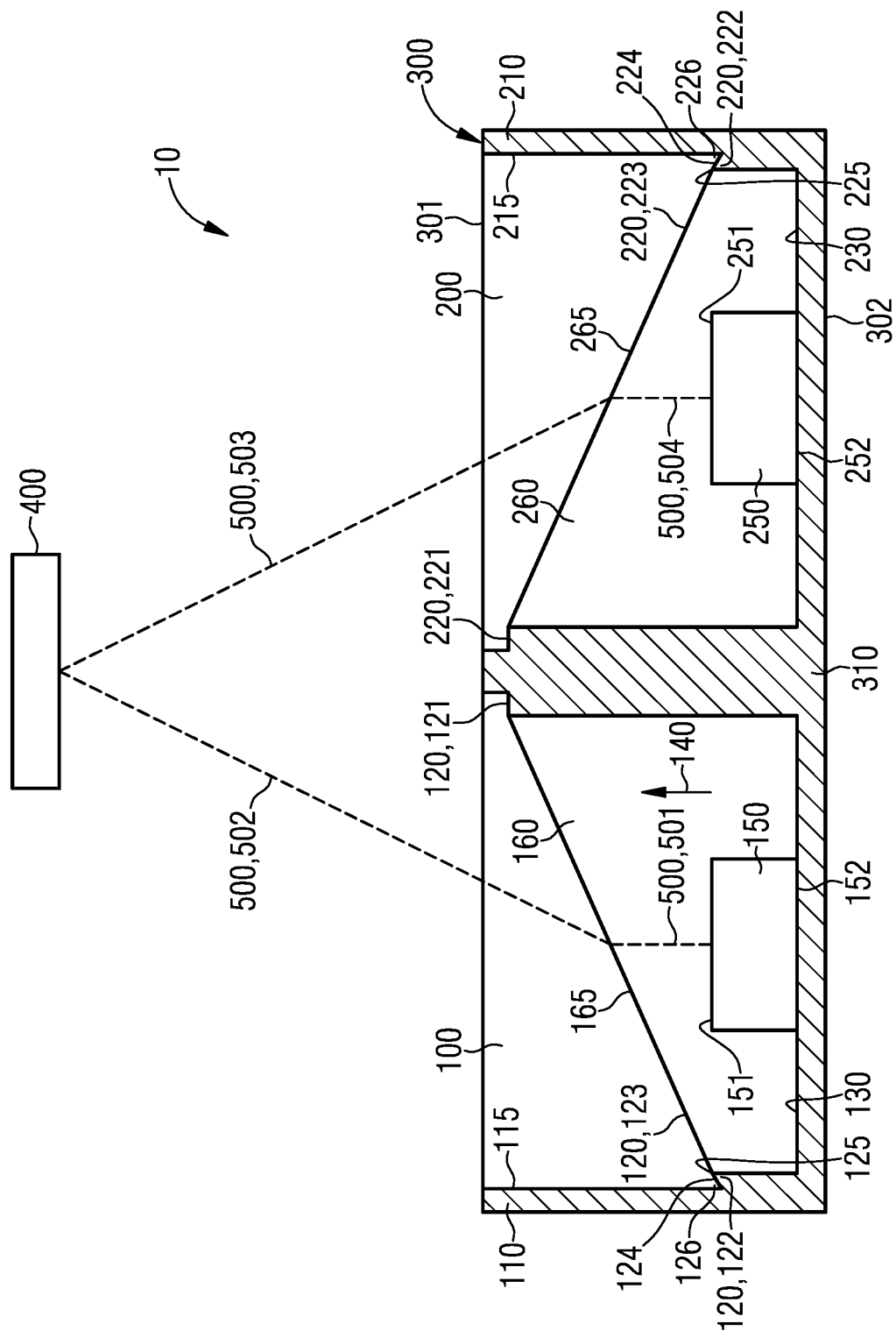
FIG. 1 schematically shows a cross-sectional view of an optoelectronic component.

10 Optoelectronic component
20 Optoelectronic component
30 Optoelectronic component
100 First cavity
110 First wall
115 Inner side of the first wall
120 First step
121 First section of the first step
122 Second section of the first step
123 Transition section of the first step
124 Plateau of the first step
125 Edge of the first step
126 First undercut
130 Bottom of the first cavity
140 Perpendicular direction
150 First optoelectronic semiconductor chip
151 Top side
152 Underside
160 First potting material
165 First potting surface
200 Second cavity
210 Second wall
215 Inner side of the second wall
220 Second step
221 First section of the second step
222 Second section of the second step
223 Transition section of the second step
224 Plateau of the second step
225 Edge of the second step
226 Second undercut
230 Bottom of the second cavity
250 Second optoelectronic semiconductor chip
251 Top side
252 Underside
260 Second potting material
265 Second potting surface
300 Housing
301 Top side
302 Underside
310 Separating region
400 Object
500 Electromagnetic radiation
501 First radiation section
502 Second radiation section
503 Third radiation section
504 Fourth radiation section

DETAILED DESCRIPTION

Our optoelectronic component comprises a housing comprising a first cavity bounded by a first wall. A circumferentially extending first step is formed at the inner side of the first wall and circumferentially extends around the first cavity obliquely with respect to a bottom of the first cavity. A first optoelectronic semiconductor chip is arranged at the bottom of the first cavity and is embedded into a first potting material arranged in the first cavity. The first potting material extends from the bottom of the first cavity as far as the first step. A first potting surface of the first potting material is formed at the first step.

Advantageously, the first potting surface of the first potting material is likewise formed obliquely in a manner corresponding to the angle of inclination of the first step circumferentially extending around the first cavity. Such an obliquely formed first potting surface may refract electromagnetic radiation (for example, visible light) comprising a direction of propagation extending perpendicular to the bottom of the first cavity. Advantageously, equipping the optoelectronic component with additional optical elements that deflect or shape emitted electromagnetic radiation may thus be obviated. This may be accompanied by a space saving and a reduction of costs.

The first step may be formed in an acute-angled fashion at least in sections.

Advantageously, this feature of the optoelectronic component prevents the first potting material from crossing over the acute-angled section of the first step, as a result of which formation of an oblique first potting surface is ensured.

The first potting material may comprise a convexly formed first potting surface.

The first potting material may comprise a concavely formed first potting surface.

Advantageously, a convexly or concavely formed first potting surface constitutes an optical element (lens) that deflects or shapes emitted electromagnetic radiation. A convexly formed first potting surface may focus electromagnetic radiation, while a concavely formed first potting surface may diverge electromagnetic radiation. As a result, equipping the optoelectronic component with additional optical components may be obviated.

The first potting material may comprise a silicone or an epoxy.

Advantageously, the potting material is obtainable cost-effectively as a result and may be arranged in the cavity of the housing in a simple manner, for example, by a metering method.

The first optoelectronic semiconductor chip arranged within the first cavity of the optoelectronic component may be configured to emit electromagnetic radiation that may pass through the first potting surface in a perpendicular direction with respect to the bottom of the first cavity.

Advantageously, the electromagnetic radiation is refracted upon passing through the first potting surface.

Furthermore, in one example, our optoelectronic component comprises a housing comprising a second cavity bounded by a second wall. A circumferentially extending second step is formed at the inner side of the second wall and circumferentially extends around the second cavity obliquely with respect to a bottom of the second cavity. A second optoelectronic semiconductor chip is arranged at the bottom of the second cavity and embedded into a second potting material arranged in the second cavity. The second potting material extends from the bottom of the second cavity as far as the second step. A second potting surface of the second potting material is formed at the second step.

One advantage of a housing comprising two cavities is that a second optoelectronic semiconductor chip arranged within the second cavity may comprise an additional functionality By way of example, it may be configured to detect electromagnetic radiation.

The second obliquely formed potting surface may be inclined oppositely compared to the first obliquely formed potting surface.

Advantageously, electromagnetic radiation that impinges on the optoelectronic semiconductor component obliquely may be aligned with the second optoelectronic semiconductor chip in this way.

The second optoelectronic semiconductor chip may be configured to detect electromagnetic radiation passing in a perpendicular direction with respect to the bottom of the second cavity after it has passed through the second potting surface and been refracted at the latter.

Expediently, the optoelectronic component may serve as a pulse sensor device or as a pulse oximetry device.

A method of producing an optoelectronic component comprises the following steps: providing a housing comprising a first cavity bounded by a first wall, wherein a circumferentially extending first step is formed at the inner side of the first wall. The first step circumferentially extends around the first cavity obliquely with respect to a bottom of the first cavity. A further step involves arranging a first optoelectronic semiconductor chip on the bottom of the first cavity. Furthermore, the method comprises arranging a first potting material in the first cavity, wherein the first potting material extends from the bottom of the first cavity as far as the obliquely formed first step circumferentially extending around the first cavity and forms a first potting surface at the first step.

One advantage of such a potting is that the optoelectronic semiconductor chip is protected from damage resulting from external influences by virtue of the arrangement of the optoelectronic semiconductor chip within the cavity of the housing.

The first potting material may be arranged in the first cavity by a metering method.

One advantage of the metering method is that a defined amount of the potting material may be arranged in a cavity.

The above-described properties, features and advantages and the way in which they are achieved are clearer and more clearly understood in association with the following description of examples explained in greater detail in association with the drawings.

FIG. 1 shows a sectional view of an optoelectronic component 10. The optoelectronic component 10 comprises a housing 300 comprising an open top side 301, a closed underside 302 and a separating region 310.

Figure 2:
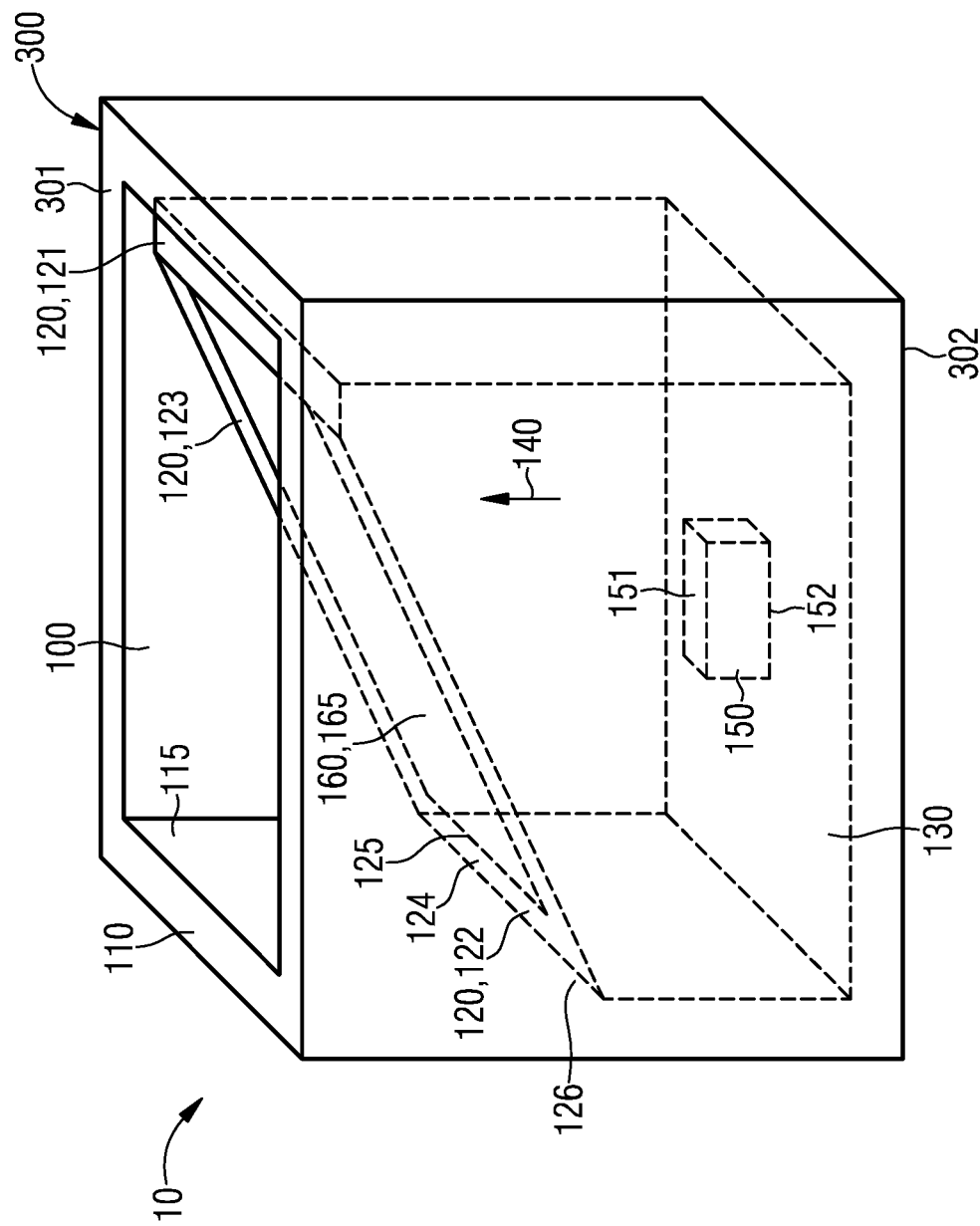
FIG. 2 schematically shows a three-dimensional view of a cavity illustrating the step arranged at the inner wall, circumferentially extends around the cavity and is formed obliquely with respect to the bottom of the cavity.

The housing 300 comprises a first cavity 100 open toward the top side 301. The first cavity 100 is enclosed by a first wall 110. FIG. 2 shows a three-dimensional view of the first cavity 100 of the optoelectronic component 10.

The exact geometric shape of the first cavity is not restricted to a rectangular base area as illustrated in FIG. 2. The base area may, for example, also be formed in a circular fashion or comprise any other shape desired.

The housing 300 may comprise a plastics material, in particular, for example, an epoxy resin. This enables the housing 300 to be produced simplify and cost-effectively by a molding method (mold method), for example, transfer molding or injection molding.

A first step 120 is arranged at an inner side 115 of the first wall 110 and circumferentially extends around the first cavity 100. The first step 120 subdivides the inner side 115 of the first wall 110 into a lower part adjoining a bottom 130 of the first cavity 100, and an upper part open toward the top side 301 of the housing. The first step 120 comprises a plateau 124, at which the first cavity 100 widens. An edge 125 is formed between the plateau 124 and the lower part of the inner side 115 of the first wall 110.

The first step 120 is formed obliquely with respect to the bottom 130 of the first cavity 100. The obliquely formed first step 120 comprises a first section 121 located at the separating region 310, a second section 122 of the first step 120 formed at the side opposite the separating region 310, and a transition section 123 formed obliquely with respect to the bottom 130 of the first cavity 100 and connecting the first section 121 and the second section 122 to one another. The first section 121 is furthermore determined by the fact that within this section the first step 120 comprises its highest vertical position within the first cavity 100. The second section 122 is furthermore determined by the fact that in this section the first step 120 comprises its lowest vertical position. The transition section 123 connects the first section 121 and the second section 122 and is formed obliquely with respect to the bottom 130 of the first cavity 100 on account of the different vertical positions of the first and second sections 121 and 122.

The first step 120 may be formed in an acute-angled fashion at least in sections. In this example, the plateau 124 of the first step 120 and the inner side 115 of the lower part of the first wall 110 form an acute angle. As a result, a first undercut 126 comprising the same acute angle as the first step 120 is formed between the inner side 115 of the upper part of the first wall 110 and the plateau 124.

It is expedient for the second section 122 of the first step 100 to be formed in an acute-angled fashion. The first section 121 and the transition section 123 may also be formed in an acute-angled fashion.

However, the first section 121, the second section 122 and the transition section 123 of the first step 100 may also comprise a different angle than an acute angle between the plateau 124 and the inner side 115 of the lower part of the first wall 110. By way of example, the first step 100 may be formed in a right-angled or an obtuse-angled fashion in the first section 121 and in the transition section 123.

A first optoelectronic semiconductor chip 150 comprises an underside 152 and a top side 151. The first optoelectronic semiconductor chip 150 is arranged by its underside 152 at the bottom 130 of the first cavity 100. It may be contacted in various ways. By way of example, the contacts may be arranged at the top side 151 or the underside 152 of the first optoelectronic semiconductor chip. The contacting may be realized in a variety of variants. By way of example, adhesive-bonding, soldering or clamping contactings are possible.

The first optoelectronic semiconductor chip 150 may be, for example, a light emitting diode chip or a laser chip. The first optoelectronic semiconductor chip 150 may emit electromagnetic radiation 500 (e.g. visible light), for example, at its top side 151 in a perpendicular direction 140 with respect to the bottom 130 of the first cavity 100. However, the first optoelectronic semiconductor chip 150 may also emit electromagnetic radiation 500 along a different direction. By way of example, an edge emitter arranged within the first cavity 100 may emit electromagnetic radiation 500 parallel to the bottom 130 of the first cavity 100, which is deflected by additional optical components that may likewise be arranged within the first cavity 100 such that the electromagnetic radiation 500 ultimately comprises a direction of propagation 140 extending perpendicular to the bottom 130 of the first cavity 100.

The first optoelectronic semiconductor chip 150 is embedded into a first potting material 160 in the first cavity 100. The first potting material 160 extends from the bottom 130 of the first cavity 100 as far as the first, obliquely formed step 120 and comprises an obliquely formed first potting surface 165.

The angle of inclination of the first potting surface 165 is given by the angle of inclination of the step formed obliquely with respect to the bottom 130 of the first cavity 100 and arranged at the inner side 115 of the first wall 110 of the first cavity 100. The first potting material 160, on account of its wetting properties, is oriented to the obliquely arranged first step 120 and thus forms the correspondingly oblique first potting surface 165.

The acute angularity formed at least in sections of the first step 120 assists the first potting material 160 in not crossing over the edge 125 of the first step 120. Expediently, a first step 120 formed in an acute-angled fashion (and an acute-angled first undercut 126) is arranged within the second section 122 of the first step 120 since the second section 122 is determined by the fact that the first step 120 comprises its lowest vertical position within the first cavity 100, as a result of which, in particular, it is possible to prevent the first potting material 160 from crossing over the edge 125 of the first step 120.

The first potting material 160 may comprise a silicone or an epoxy and is furthermore distinguished by the fact that it comprises a refractive index different than that of the medium in the surroundings (for example, air) of the optoelectronic component 10.

One special feature of the optoelectronic component 10 is the fact that the first potting surface 165 of the first potting material 160 is formed such that it may refract electromagnetic radiation 500 in a desired manner. In this optoelectronic component 10, the potting surface 165 thus comprises the function of an optical unit. As illustrated in FIG. 1, electromagnetic radiation 500 with a perpendicular direction of propagation 140 is refracted upon passing through the first potting surface 165. As a result, additional optical elements for guiding and shaping electromagnetic radiation 500 need not necessarily be provided.

The housing 300 furthermore comprises a second cavity 200 enclosed by a second wall 210. The first cavity 100 and the second cavity 200 are separated from one another by the separating region 310.

A second step 220 is arranged at an inner side 215 of the second wall 210 and circumferentially extends around the second cavity 200. The second step 220 subdivides the inner side 215 of the second wall 210 into a lower part that adjoins a bottom 230 of the second cavity 200, and an upper part open toward the top side 301 of the housing. The second step 220 comprises a plateau 224, at which the second cavity 200 widens. An edge 225 is formed between the plateau 224 and the lower part of the inner side 215 of the second wall 210.

The second step 220 is formed obliquely with respect to the bottom 230 of the second cavity 200. The obliquely formed second step 220 comprises a first section 221 located at the separating region 310, a second section 222 of the second step 220 formed at the side opposite the separating region 310, and a transition section 223 formed obliquely with respect to the bottom 230 of the second cavity 200 and connecting the first section 221 and the second section 222 to one another. The first section 221 is furthermore determined by the fact that within this section the second step 220 comprises its highest vertical positon within the second cavity 200. The second section 222 is furthermore determined by the fact that in this section the second step 220 comprises its lowest vertical position. The transition section 223 connects the first section 221 and the second section 222 and is formed obliquely with respect to the bottom 230 of the second cavity 200 on account of the different vertical positions of the first and second sections 221 and 222.

The second step 220 may be formed in an acute-angled fashion at least in sections. In this example, the plateau 224 of the second step 220 and the inner side 215 of the lower part of the second wall 210 form an acute angle. As a result, a second undercut 226 comprising the same acute angle as the second step 220 is formed between the inner side 215 of the upper part of the second wall 210 and the plateau 224.

It is expedient for the second section 222 of the first step 200 to be formed in an acute-angled fashion. The first section 221 and the transition section 223 may also be formed in an acute-angled fashion.

However, the first section 221, the second section 222 and the transition section 223 of the second step 220 may also comprise a different angle than an acute angle between the plateau 224 and the inner side 215 of the lower part of the second wall 210. By way of example, the second step 220 may be formed in a right-angled or an obtuse-angled fashion in the first section 221 and in the transition section 223.

In the example illustrated, the second cavity 200 is formed mirror-symmetrically with respect to the first cavity 100. However, this is not absolutely necessary.

A second optoelectronic semiconductor chip 250 comprises an underside 252 and a top side 251. The second optoelectronic semiconductor chip 250 is arranged by its underside 252 at the bottom 230 of the second cavity 200. It may be contacted in various ways. By way of example, the contacts may be arranged at the top side 251 or the underside 252 of the second optoelectronic semiconductor chip. The contacting may be realized in a variety of variants. By way of example, adhesive-bonding, soldering or clamping contactings are possible.

The second optoelectronic semiconductor chip 250 may be, for example, a photodiode. The second optoelectronic semiconductor chip 250 may detect electromagnetic radiation 500 (e.g. visible light) that impinges on its top side 251. However, the second optoelectronic semiconductor chip 250 may also detect electromagnetic radiation 500 incident along a direction that deviates from the perpendicular direction 140.

The second optoelectronic semiconductor chip 250 is embedded into a second potting material 260. The second potting material 260 extends from the bottom 230 of the second cavity 200 as far as the second, obliquely formed step 220 and comprises an obliquely formed second potting surface 265. The second potting material 260 may comprise a silicone or an epoxy.

In the example illustrated, the second potting surface 265 is formed in a manner inclined oppositely compared to the first potting surface 165.

The acute angularity formed at least in sections of the second step 220 assists the second potting material 260 in not crossing over the edge 225 of the second step 220. Expediently, a second step 220 formed in an acute-angled fashion (and an acute-angled first undercut 226) is arranged within the second section 222 of the second step 220 since the second section 222 is determined by the fact that the second step 220 comprises its lowest vertical position within the second cavity 200, as a result of which, in particular, it is possible to prevent the second potting material 260 from crossing over the edge 225 of the second step 220.

Electromagnetic radiation 500 emitted by the first optoelectronic semiconductor chip 150 may propagate within a first radiation section 501 in a perpendicular direction 140 with respect to the bottom 130 of the first cavity 100. Upon passing through the first potting surface 165, the electromagnetic radiation 500 emerges from the first potting material 160, is refracted and passes within a second radiation section 502 comprising a direction of propagation that is deflected relative to the first radiation section 501.

The second radiation section 502 of the electromagnetic radiation 500 may be aligned with an object 400, for example. The electromagnetic radiation 500 is scattered at the object 400 and propagates within a third radiation section 503 in the direction of the second potting surface 265. Upon passing through the second potting surface 265, the electromagnetic radiation is refracted again, penetrates into the second potting material 260 and afterward may propagate within a fourth radiation section 504 in a perpendicular direction 140 with respect to the bottom 230 of the second cavity 200 and may be detected by a second optoelectronic semiconductor chip 250.

The optoelectronic component 10 may, for example, be a pulse sensor and ascertains a pulse rate or an oxygen saturation in the blood of a human patient. In this example, the electromagnetic radiation 500 emitted by the first optoelectronic semiconductor chip 150 is directed onto a patient's skin, scattered in the skin in a pulse-dependent manner and detected by the second optoelectronic semiconductor chip 250. By virtue of the fact that the first optoelectronic semiconductor chip 150 and the second optoelectronic semiconductor chip 250 are arranged in the cavities 100, 200 of the housing 300 separated by the separating region 310, an undesired crosstalk of the signals is minimized and the efficiency of the measurement increased in this way. In the example of this device, the obliquely formed potting surfaces 165 and 265 function as optical elements and serve for deflecting the electromagnetic radiation 500.

The optoelectronic component 10 may also be a pulse oximeter or some other optoelectronic component. A plurality of optoelectronic semiconductor chips might also be arranged in each of the cavities 100, 200. By way of example, it is possible to arrange a plurality of emitting optoelectronic semiconductor chips in the first cavity 100 that differ with regard to the wavelength of the emitted electromagnetic radiation 500.

In a simplified example of the optoelectronic component 10, one of the cavities 100, 200 and the optoelectronic semiconductor chip 150, 250 arranged therein may be omitted.

Figure 3:
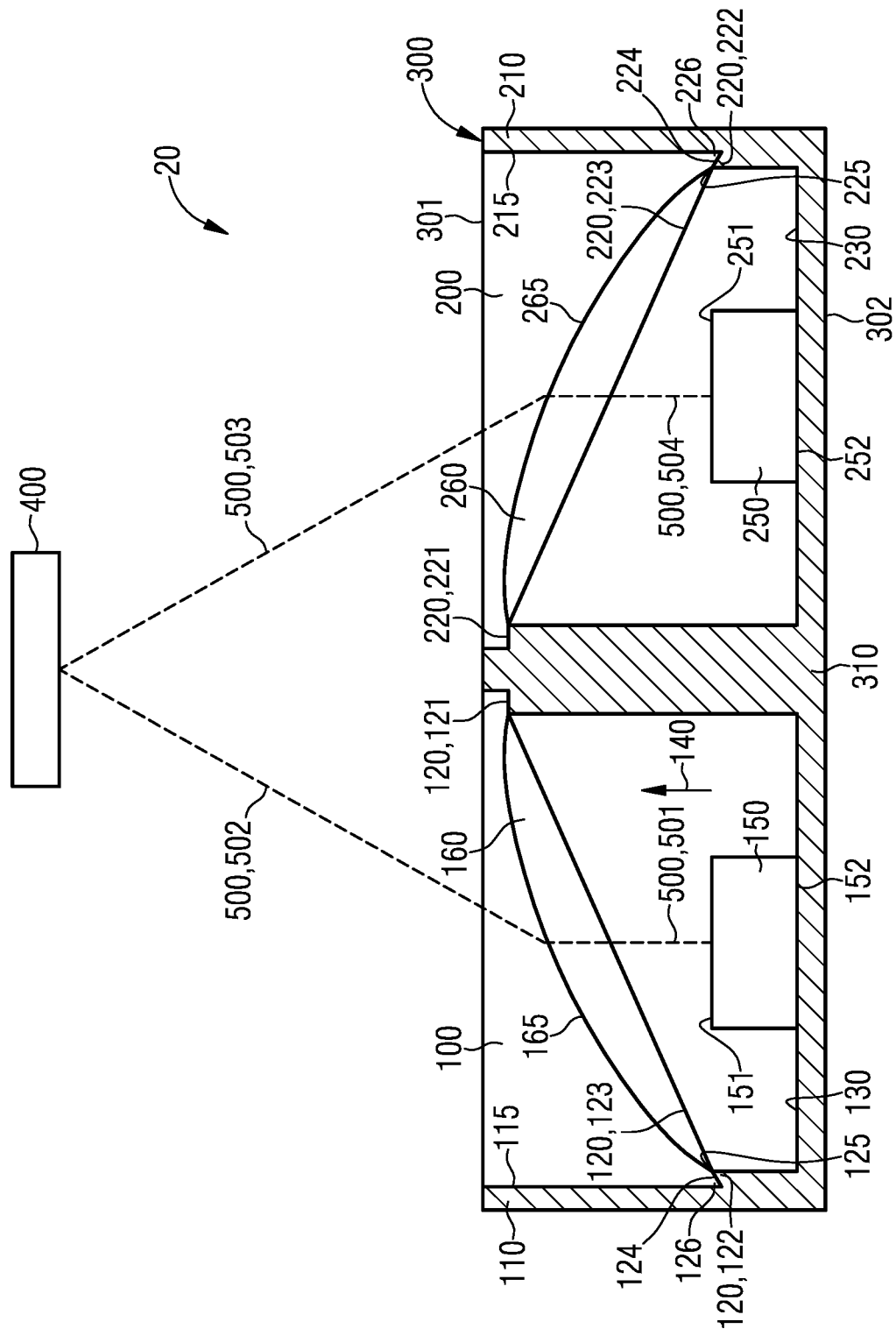
FIG. 3 schematically shows a sectional illustration of a second example of the optoelectronic component comprising convex potting surface.

FIG. 3 shows a cross section of an optoelectronic component 20 formed in a similar manner to the optoelectronic component 10, wherein both optoelectronic components 10 and 20 are provided with the same reference signs. Apart from the different geometries of the first and second potting surfaces 165 and 265, all other features of the embodiment 20 correspond to those of the optoelectronic component 10.

The optoelectronic component 20 comprises a first potting surface 165 and a second potting surface 265, both of which are formed in a convex fashion. The first and second potting material 160 and 260 thus each comprise a potting surface 165 and 265 curved toward the top side 301 of the housing 300.

The convexly formed potting surfaces 165 and 265 may be produced, proceeding from planar potting surfaces 165 and 265, by introducing a larger amount of the potting materials 160 and 260.

FIG. 4 shows a cross section of an optoelectronic component 30 formed in a similar manner to the optoelectronic component 10, wherein both optoelectronic components 10 and 30 are provided with the same reference signs. Apart from the different geometries of the first and second potting surfaces 165 and 265, all other features of the example 30 correspond to those of the optoelectronic component 10.

The optoelectronic component 30 comprises a first potting surface 165 and a second potting surface 265, both of which are formed in a concave fashion. The first and second potting materials 160 and 260 thus each comprise a potting surface 165 and 265 curved toward the underside 302 of the housing 300.

The concavely formed potting surfaces 165 and 265 may be produced relative to planar potting surfaces 165 and 265 by introducing a smaller amount of the potting materials 160 and 260.

Apart from being realized by the amount of the potting materials 160 and 260 introduced, differently shaped potting surfaces may, for example, also be realized by different wetting properties of the potting materials. Various combinations of correspondingly chosen potting and housing materials may be used to set the wetting properties of the potting materials in a desired manner. The geometry of a potting surface may thus be defined. In this context, it is also possible, for example, to correspondingly coat the inner walls of the housing with thin films of different chemical compositions. By way of example, if a hydrophilic potting material is used, then a hydrophobic coating of the inner walls may promote formation of a convex potting surface, while a hydrophilic coating a likewise hydrophilic potting material may promote formation of a concave potting surface.

In a method of producing the optoelectronic components 10, 20, 30, the housing 300 comprising the first cavity 100 is provided, wherein the first wall 110 bounds the first cavity 100. The first step 120 extending circumferentially around the first cavity 100 and formed obliquely with respect to a bottom 130 of the first cavity 100 is arranged at the inner side of the first wall 115.

In a further method step, the first optoelectronic semiconductor chip 150 is arranged on the bottom 130 of the first cavity 100.

In a further method step, the first potting material 160 is arranged in the first cavity 100, wherein the first potting material 160 extends from the bottom 130 of the first cavity 100 as far as the obliquely formed first step 120 circumferentially extending around the first cavity 100 at the inner side of the first wall 115. In this way, the first optoelectronic semiconductor chip 150 is embedded into the first potting material 160.

The first potting material 160 may be arranged in the first cavity 100 by a metering method, for example. The metering method makes it possible to introduce a defined amount of the first potting material 160 into the first cavity 100. In particular, the metering method, by virtue of its accuracy, makes it possible to realize different geometries of the first potting surface 165. A first potting surface 165 formed in a convex fashion or in a concave fashion may be arranged, for example, by a larger or smaller amount of the first potting material 160 being arranged in the first cavity 100 in a targeted manner.

Our components and methods have been illustrated and described in greater detail on the basis of the preferred examples. Nevertheless, this disclosure is not restricted to the examples disclosed. Rather, other variations may be derived therefrom by those skilled in the art, without departing from the scope of protection of the appended claims.

This application claims priority of DE 10 2017 101 267.2, the subject matter of which is incorporated herein by reference.

The invention claimed is:

1. An optoelectronic component comprising a housing comprising a first cavity bounded by a first wall, wherein a circumferentially extending first step is formed at an inner side of the first wall, the first step circumferentially extends around the first cavity obliquely with respect to a bottom of the first cavity, a first optoelectronic semiconductor chip is arranged at the bottom of the first cavity, the first optoelectronic semiconductor chip is embedded into a first potting material arranged in the first cavity and extending from the bottom of the first cavity as far as the first step, a first potting surface of the first potting material is formed at the first step, and the first potting surface of the first potting material is likewise formed obliquely in a manner corresponding to an angle of inclination of the first step formed obliquely with respect to the bottom of the first cavity.

2. The optoelectronic component according to claim 1, wherein the first step is an acute-angle at least in sections.

3. The optoelectronic component according to claim 1, wherein the first potting surface is convex.

4. The optoelectronic component according to claim 1, wherein the first potting surface is concave.

5. The optoelectronic component according to claim 1, wherein the first potting material comprises a silicone or an epoxy.

6. The optoelectronic component according to claim 1, wherein the first optoelectronic semiconductor chip is configured to emit electromagnetic radiation passing through the first potting surface in a perpendicular direction with respect to the bottom of the first cavity.

7. The optoelectronic component according to claim 1, wherein the housing comprises a second cavity bounded by a second wall, a circumferentially extending second step is formed at an inner side of the second wall, the second step circumferentially extends around the second cavity obliquely with respect to a bottom of the second cavity, a second optoelectronic semiconductor chip is arranged at the bottom of the second cavity, the second optoelectronic semiconductor chip is embedded into a second potting material arranged in the second cavity and extending from the bottom of the second cavity as far as the second step, and a second potting surface of the second potting material is formed at the second step.

8. The optoelectronic component according to claim 7, wherein the second potting surface is inclined oppositely compared to the first potting surface.

9. The optoelectronic component according to claim 7, wherein the second optoelectronic semiconductor chip is configured to detect electromagnetic radiation.

10. A method of ascertaining a pulse rate and/or an oxygen saturation by utilizing an optoelectronic component according to claim 7 comprising:
   emitting electromagnetic radiation by the first optoelectronic semiconductor chip, and
   detecting electromagnetic radiation scattered in a patient's skin in a pulse-dependent manner.

* * * * *